(12) United States Patent
Kemmerling

(10) Patent No.: US 8,122,309 B2
(45) Date of Patent: Feb. 21, 2012

(54) METHOD AND APPARATUS FOR PROCESSING FAILURES DURING SEMICONDUCTOR DEVICE TESTING

(75) Inventor: Todd Ryland Kemmerling, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 579 days.

(21) Appl. No.: 12/046,009

(22) Filed: Mar. 11, 2008

(65) Prior Publication Data

US 2009/0235131 A1    Sep. 17, 2009

(51) Int. Cl.
*G01R 31/28* (2006.01)
*G06F 11/00* (2006.01)

(52) U.S. Cl. .......... 714/724; 714/736; 714/740

(58) Field of Classification Search .......... 714/724, 714/733, 734, 726, 736, 819, 735, 718, 703, 714/719, 742, 723, 740; 341/144, 155, 110
See application file for complete search history.

(56) References Cited

U.S. PATENT DOCUMENTS

| | | | |
|---|---|---|---|
| 3,781,683 A | 12/1973 | Freed | |
| 3,827,820 A | 8/1974 | Hoffman | |
| 4,038,599 A | 7/1977 | Bove et al. | |
| 4,455,654 A * | 6/1984 | Bhaskar et al. | 714/28 |
| 4,468,616 A | 8/1984 | Yoshizaki | |
| 4,523,144 A | 6/1985 | Okubo et al. | |
| 4,706,018 A | 11/1987 | Beha et al. | |
| 4,780,670 A | 10/1988 | Cherry | |
| 4,837,622 A | 6/1989 | Whann et al. | |
| 4,899,099 A | 2/1990 | Mendenhall | |
| 5,070,297 A | 12/1991 | Kwon | |
| 5,090,118 A | 2/1992 | Kwon et al. | |
| 5,103,557 A | 4/1992 | Leedy | |
| 5,148,103 A | 9/1992 | Pasiecznik, Jr. | |
| 5,162,728 A | 11/1992 | Huppenthal | |
| 5,172,050 A | 12/1992 | Swapp | |
| 5,187,020 A | 2/1993 | Kwon et al. | |
| 5,191,708 A | 3/1993 | Kasukabe et al. | |
| 5,243,274 A * | 9/1993 | Kelsey et al. | 714/724 |
| 5,261,155 A | 11/1993 | Angulas et al. | |
| 5,323,107 A * | 6/1994 | D'Souza | 324/754 |
| 5,357,523 A | 10/1994 | Bogholtz, Jr. et al. | |
| 5,363,038 A | 11/1994 | Love | |
| 5,367,254 A | 11/1994 | Faure et al. | |
| 5,389,556 A | 2/1995 | Rostoker et al. | |
| 5,406,210 A | 4/1995 | Pedder | |
| 5,422,574 A | 6/1995 | Kister | |
| 5,434,513 A | 7/1995 | Fujii et al. | |
| 5,442,282 A | 8/1995 | Rostoker et al. | |
| 5,476,211 A | 12/1995 | Khandros | |
| 5,479,105 A | 12/1995 | Kim et al. | |
| 5,491,426 A | 2/1996 | Small | |
| 5,495,667 A | 3/1996 | Farnworth et al. | |
| 5,497,079 A | 3/1996 | Yamada et al. | |

(Continued)

FOREIGN PATENT DOCUMENTS

DE    9004562    8/1990

(Continued)

*Primary Examiner* — Phung M Chung
(74) *Attorney, Agent, or Firm* — Kirton & McConkie

(57) ABSTRACT

Methods and apparatus for processing failures during semiconductor device testing are described. Examples of the invention can relate to testing a device under test (DUT). Fail capture logic can be provided, coupled to test probes and memory, to indicate only first failures of failures detected on output pins of the DUT during a test for storage in the memory.

20 Claims, 4 Drawing Sheets

FIG. 5

U.S. PATENT DOCUMENTS

| | | | |
|---|---|---|---|
| 5,532,610 A | 7/1996 | Tsujide et al. | |
| 5,534,784 A | 7/1996 | Lum et al. | |
| 5,568,054 A | 10/1996 | Lino et al. | |
| 5,570,032 A | 10/1996 | Atkines et al. | |
| 5,600,257 A | 2/1997 | Leas et al. | |
| 5,610,925 A * | 3/1997 | Takahashi | 714/724 |
| 5,625,297 A | 4/1997 | Arnaudov et al. | |
| 5,642,054 A | 6/1997 | Pasiecznik, Jr. | |
| 5,648,661 A | 7/1997 | Rostoker et al. | |
| 5,669,774 A | 9/1997 | Grabbe | |
| 5,670,889 A | 9/1997 | Okubo et al. | |
| 5,686,842 A | 11/1997 | Lee | |
| 5,701,085 A | 12/1997 | Malladi et al. | |
| 5,701,666 A | 12/1997 | DeHaven et al. | |
| 5,736,850 A | 4/1998 | Legal | |
| 5,764,072 A | 6/1998 | Kister | |
| 5,772,451 A | 6/1998 | Dozier, II et al. | |
| 5,806,181 A | 9/1998 | Khandros et al. | |
| 5,821,763 A | 10/1998 | Beaman et al. | |
| 5,829,128 A | 11/1998 | Eldridge et al. | |
| 5,832,601 A | 11/1998 | Eldridge et al. | |
| 5,834,946 A | 11/1998 | Albrow et al. | |
| 5,838,163 A | 11/1998 | Rostoker et al. | |
| 5,864,946 A | 2/1999 | Eldridge et al. | |
| 5,878,486 A | 3/1999 | Eldridge et al. | |
| 5,884,398 A | 3/1999 | Eldridge et al. | |
| 5,897,326 A | 4/1999 | Eldridge et al. | |
| 5,900,738 A | 5/1999 | Khandros et al. | |
| 5,917,707 A | 6/1999 | Khandros et al. | |
| 5,974,662 A | 11/1999 | Eldridge et al. | |
| 5,983,493 A | 11/1999 | Eldridge et al. | |
| 5,998,228 A | 12/1999 | Eldridge et al. | |
| 6,029,344 A | 2/2000 | Khandros et al. | |
| 6,032,356 A | 3/2000 | Eldridge et al. | |
| 6,059,982 A | 5/2000 | Palagonia et al. | |
| 6,064,213 A | 5/2000 | Khandros et al. | |
| 6,110,823 A | 8/2000 | Eldridge et al. | |
| 6,133,744 A | 10/2000 | Yojima et al. | |
| 6,174,744 B1 | 1/2001 | Watanabe et al. | |
| 6,219,908 B1 | 4/2001 | Farnworth et al. | |
| 6,275,051 B1 | 8/2001 | Bachelder et al. | |
| 6,316,988 B1 | 11/2001 | Forehand et al. | |
| 6,405,333 B1 * | 6/2002 | Sopkin | 714/724 |
| 6,525,555 B1 | 2/2003 | Khandros et al. | |
| 6,535,555 B1 | 3/2003 | Bordes et al. | |
| 6,536,005 B1 * | 3/2003 | Augarten | 714/723 |
| 6,655,023 B1 | 12/2003 | Eldridge et al. | |
| 6,788,094 B2 | 9/2004 | Khandros et al. | |
| 6,856,150 B2 | 2/2005 | Sporck et al. | |
| 7,078,926 B2 | 7/2006 | Khandros et al. | |
| 7,116,119 B2 | 10/2006 | Sporck et al. | |
| 7,307,433 B2 | 12/2007 | Miller et al. | |
| 7,345,493 B2 | 3/2008 | Khandros et al. | |
| 2003/0107394 A1 | 6/2003 | Khandros et al. | |
| 2004/0068869 A1 | 4/2004 | Eldridge et al. | |

FOREIGN PATENT DOCUMENTS

| | | |
|---|---|---|
| EP | 047141 | 3/1982 |
| EP | 699912 | 3/1996 |
| EP | 708338 | 4/1996 |
| FR | 2645679 | 10/1990 |
| JP | 02-159585 | 6/1990 |
| JP | 06-180342 | 6/1994 |
| JP | 07-111283 | 4/1995 |
| JP | 08-37215 | 2/1996 |
| JP | 08-50162 | 2/1996 |
| JP | 08/129053 | 5/1996 |
| JP | 08-184612 | 7/1996 |
| WO | 91/12706 | 8/1991 |
| WO | 95/14314 | 5/1995 |
| WO | 96/08056 | 3/1996 |
| WO | 96-15459 | 5/1996 |
| WO | 98-01906 | 1/1998 |

* cited by examiner

METHOD AND APPARATUS FOR PROCESSING FAILURES DURING SEMICONDUCTOR DEVICE TESTING

BACKGROUND OF THE INVENTION

1. Field of the Invention

Embodiments of the present invention relate to semiconductor testing.

2. Description of the Related Art

Testing is an important step in the production of semiconductor devices for use. Typically, partially or fully completed semiconductor devices may be tested by bringing terminals disposed on an upper surface of a device to be tested—also referred to as a device under test (or DUT)—into contact with resilient contact elements, for example, as contained in a probe card assembly, as part of a test system. A test system controller may be coupled to the probe card assembly to send and receive test signals to and from the DUTs over a set of test channels. A test system controller with increased test channels can be a significant cost factor for a test system. Test system controllers have evolved to increase the number of channels and hence the number of devices that can be tested in parallel (sometimes referred to as multi-site testing).

During testing, some test channels provide inputs to input pins of the DUTs, others test channels monitor for outputs from output pins of the DUTs, and still others provide inputs to and monitor for outputs from input/output (IO) pins of the DUTs. When a test channel detects an output produced by a DUT, the test channel can compare the output with an expected output. For a functional DUT, the output matches the expected output. If the output from a pin of a DUT does not match the expected output, the test channel can generate an indication of a failure for that pin of that DUT. The failure indication can then be stored in a memory ("failure memory"). In this manner, the failure memory can store one or more failure indications for various pins of various DUTs during testing. The memory can be accessed by the test system controller (e.g., a host computer) to detect which DUTs have failures.

A test may include a plurality of test cycles, each of which includes providing input signals to the DUTs and monitoring for output signals from the DUTs. If a pin on a DUT fails on a test cycle, the pin may continue to fail on subsequent test cycles. The more test cycles in the test, the more failures detected and stored in the failure memory. In some cases, if a pin continues to fail for each test cycle, the failure memory may not be large enough to store all of the corresponding failure indications for that pin (i.e., the memory will overflow). Further, the failure memory may be filled with failure indications for one DUT pin and have no room for failure indications subsequently generated by other DUT pins. Thus, overflow of the failure memory may lead to some defective DUTs escaping detection during the test. In case of failure memory overflow, a test engineer can disable the failing DUT and re-run the test. This may lead to further failure memory overflows, requiring several iterations of the same test, increasing test time, and increasing test cost.

Accordingly, there exists a need in the art for a method and apparatus for testing semiconductor devices that attempts to overcome at least some of the aforementioned deficiencies.

SUMMARY OF THE INVENTION

Embodiments of the invention can relate to apparatus for testing a device under test (DUT). In some embodiments, an apparatus can include fail capture logic, coupled to test probes and memory, to indicate only first failures of failures detected on output pins of the DUT during a test for storage in the memory.

Embodiments of the invention can relate to test assemblies. In some embodiments, a test assembly can include a probe card assembly supporting test probes configured to contact pins of a device under test (DUT); and test instruments having test channels, each of the test channels including: a memory; and fail capture logic, coupled to the memory and to at least one of the test probes contacting at least one output pin of the pins, to indicate only first failures on the at least one output pin during a test for storage in the memory.

Embodiments of the invention can relate to methods of testing a DUT using a probe card assembly. In some embodiments, a method of testing a DUT using a probe card assembly can include applying test signals to input pins of the DUT during a test via test probes supported on the probe card assembly, receiving test result signals derived from output pins of the DUT responsive to the test signals, and storing in a memory only indications of first failures on the output pins as identified based on the test result signals for the test.

BRIEF DESCRIPTION OF THE DRAWINGS

So that the manner in which features of the various embodiments of the present invention can be understood in detail, a more particular description of the invention, briefly summarized above and described more fully below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images used in the drawings are simplified for illustrative purposes and are not necessarily depicted to scale.

DETAILED DESCRIPTION

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

The present invention provides methods and apparatus for processing failures during semiconductor device testing. Aspects of the invention relate to fail capture logic in a test system for output pins of a device under test (DUT). The fail capture logic can detect and indicate failures on any of the output pins during a test. A fail capture memory can be configured to store indications of failures for the output pins generated by the fail capture logic. In some embodiments, the fail capture logic may be augmented with disable logic. The disable logic can disable the indication of failures for each of the output pins after a first failure occurs. In this manner, only first failures of the output pins are stored in the fail capture memory for the test. For any output pin having a first failure, subsequent failures are not stored in the fail capture memory. Accordingly, space in the fail capture memory is conserved and any output pin that generates more failures than can be stored in the fail capture memory will not cause the fail capture memory to overflow. Moreover, the fail capture memory can be configured to space to store enough failure indications for all of the output pins. In this manner, all of the output pins that are failing can be detected in a single iteration of the test. These and other aspects and embodiments of the invention are described in detail below.

Figure 1:
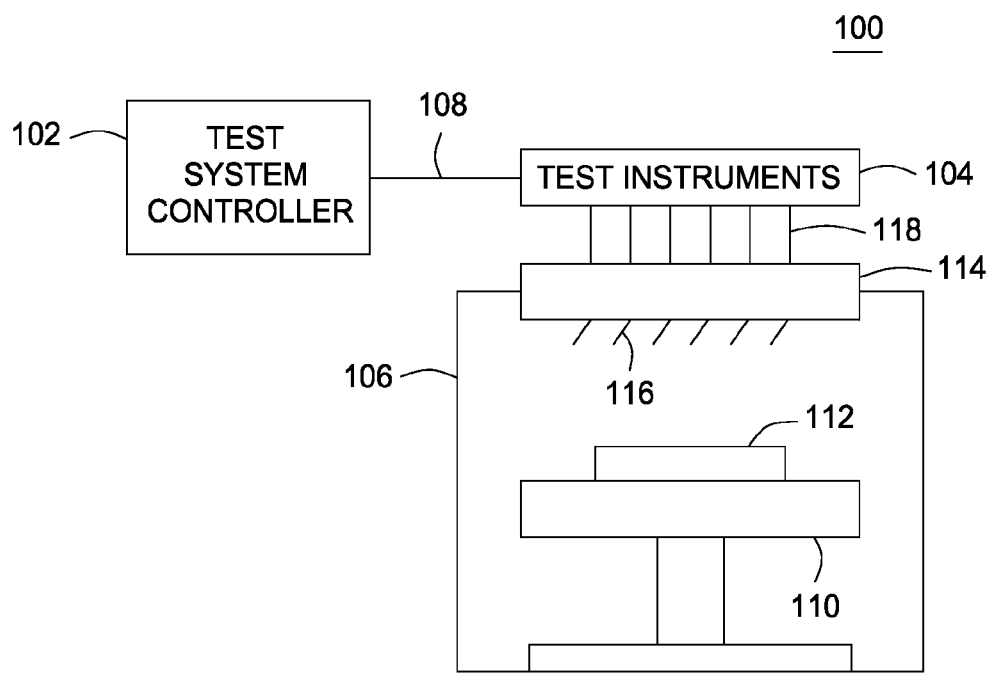
FIGS. 1 and 2 depict a test system according to some embodiments of the invention.
Figure 2:
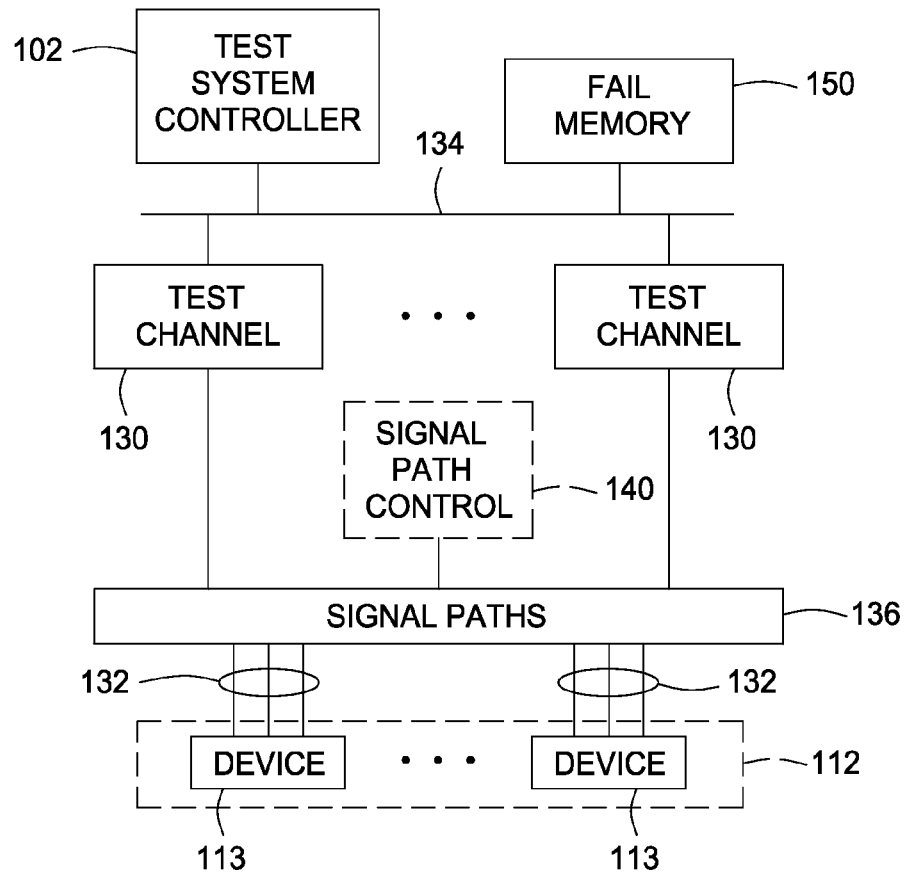

FIGS. 1 and 2 depict a test system 100 according to some embodiments of the invention. The test system 100 can generally include a test system controller 102, test instruments 104, a probe card assembly 114, and a prober 106. The test system controller 102 can be coupled to the test instruments 104 by a communication link 108. The test system controller 102 may comprise a host computer, for example. The prober 106 can include a stage 110 for mounting a device under test (DUT) 112 being tested. The DUT 112 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, can refer to one or a plurality of such electronic devices. For purposes of clarity by example, assume the DUT 112 includes a plurality of devices 113, each of which includes a plurality of pins 132. The term "pin" can refer to any pin, pad, or like conductive element on a device that functions as an input, output, or input/output (IO) terminal.

The test instruments 104 can include a plurality of test channels 130. Each of the test channels 130 may be used to convey test signals to the DUT 112, receive test result signals from the DUT 112, or both provide test signals to, and receive test result signals from, the DUT 112. As used herein, the term "test signal" can refer to a signal output by the test instruments 104 and input to the DUT 112. The term "test result signal" can refer to a signal or combination of signals output by the DUT 112 and input to the test instruments 104.

The probe card assembly 114 can include probes 116 (also referred to as test probes) that contact the DUT 112. The stage 110 can be movable to contact the DUT 112 with probes 116. The test instruments 104 may be linked by connectors 118 to the probe card assembly 114. The links provided by the connectors 118 can be divided among the test channels 130. The connectors 118 may be any suitable connectors, such as flexible cable connectors, pogo pins, zero insertion force (ZIF) connectors, or the like. The connectors 118 may be coupled to signal paths 136. In general, the signal paths 136 can couple each of the test channels 130 to one or more of the probes 116 such that each test channel 130 communicates with a respective one or more pins 132 of the DUT 112.

Notably, in some embodiments, the probe card assembly 114 can fan out one or more of the test channels 130 among multiple pins 132 of the DUT 112. This reduces the number of test channels 130 required to test the DUT 112. The signal paths 136 can include sets of branched paths, each for linking one of the test channels 130 to a plurality of probes 116. The signal paths 136 may include various components for isolating the branches in each set of branched paths so that a fault at one pin of the DUT 112 that affects one branch will not substantially influence the other branches. Such components may include, for example, resistors, relays, three-state buffers, other types of switches, and/or like type components. In some embodiments, the signal paths 136 can be coupled to signal path control logic 140, which provides for control of isolation components (e.g., control of switches). Various structures of the signal paths 136 for fanning out test channels may be used. In general, the signal paths 136 can provide a mechanism for a test channel 130 to provide a test signal to multiple pins 132 of the DUT 112, or to receive a test result signal that is a combination of output signals received from multiple pins 132 of the DUT 112.

The test channels 130 can be configured for communication with the test system controller 102 via a communication link 134 (e.g., a bus or like type interconnection logic). A test can be organized into a succession of test cycles. During each test cycle, a test channel 130 may provide a test signal to one or more pins of the DUT 112, or may receive a test result signal having a voltage representing logical state of one or more output signals generated by the DUT 112. To start a test, the test system controller 102 can supply instructions to the test channels 130 that dictate what each of the test channels 130 will do during each test cycle. For test channels 130 that receive test result signals, the test system controller 102 can provide expected values for the test result signals in the instructions. A test channel 130 can compare a received test result signal with an expected value. In cases where the test result signal does not match the expected value, a test channel 130 can indicate a failure for the particular pin on the DUT 112 that caused the test result signal to deviate from the expected value.

The test channels 130 can be coupled to a failure memory 150 via the communication link 134. The failure memory 150 may be implemented using one or more memory devices, such as random access memory (RAM) devices. In response to a failure on a pin of the DUT 112, a test channel 130 can cause an indication of the failure for that pin to be stored in the failure memory 150 ("failure indication"). The process of storing a failure indication in the failure memory 150 is referred to as logging the failure. As discussed further below, once a test channel 130 detects and logs a failure on a particular pin of the DUT 112, the test channel 130 disables failure logging for that particular pin. Thus, only the first failure on a pin is logged, which conserves space in the failure memory 150. Logging only the first failure on a pin also avoids a potential overflow condition of the failure memory 150 in case the pin continues to fail for several test cycles producing more failure indications than can be stored in the failure memory 150.

The test system controller 102 may access the failure memory 150 to obtain any failure indications generated as a result of the test. The failure memory 150 may include enough space to store failure indications for all of the pins 132 of the DUT 112 (i.e., the worst case scenario). In this manner, all failing pins can be logged in a single execution of the test, obviating the need to re-run the test multiple times to isolate multiple failing pins.

Figure 3:
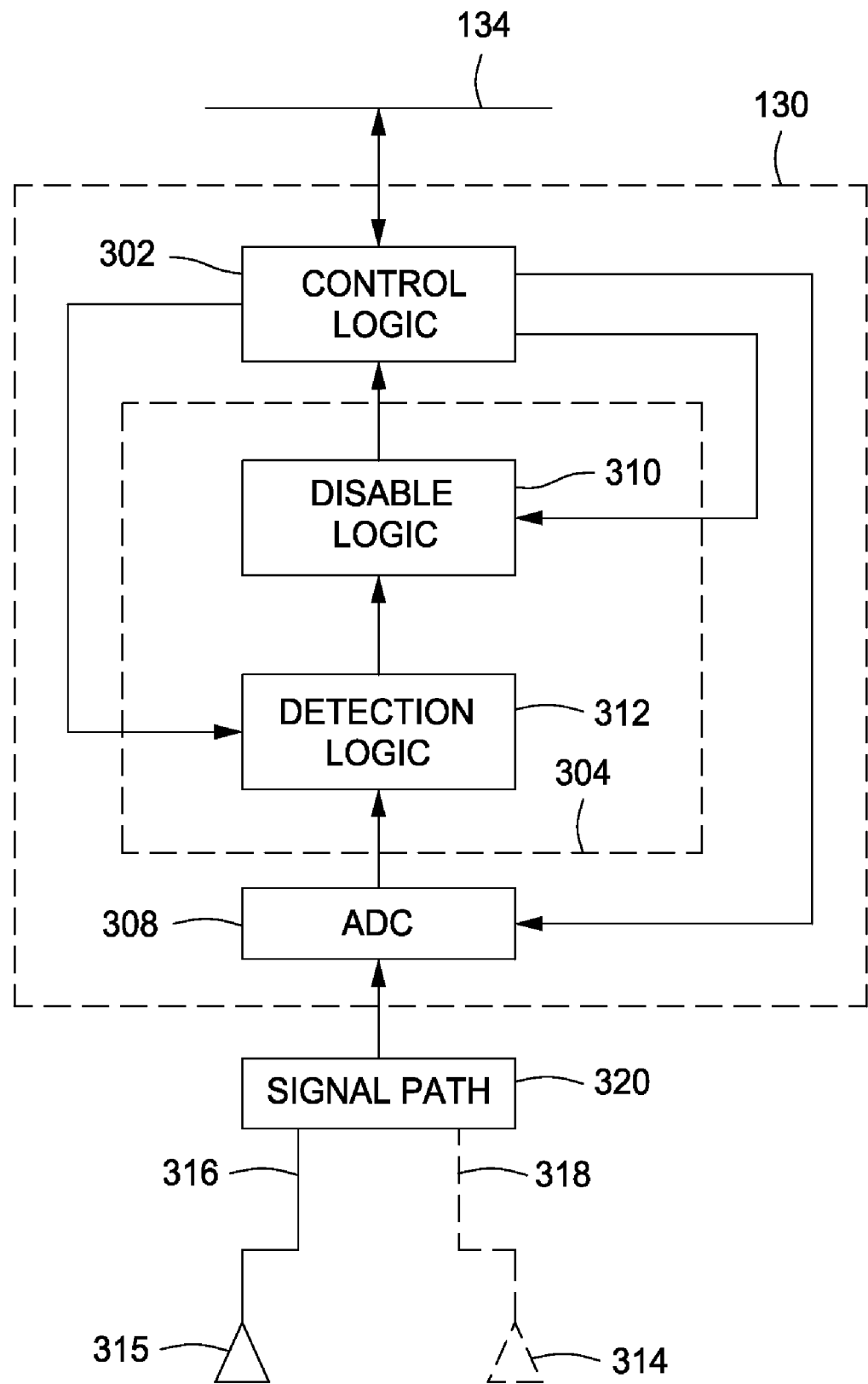
FIG. 3 is a block diagram depicting a test channel according to some embodiments of the invention.

FIG. 3 is a block diagram depicting a test channel 130 according to some embodiments of the invention. Portions of the test channel 130 related to providing a test signal to the DUT 112 are omitted for clarity. The test channel 130 can include control logic 302, fail capture logic 304, and an analog-to-digital converter (ADC) 308. The fail capture logic 304 may include disable logic 310 and detection logic 312. An IO interface of the control logic 302 can be coupled to the communication link 134. An input of the control logic 302 can be coupled to an output of the disable logic 310. Outputs of the control logic 302 can be coupled to inputs of the disable logic 310, the detection logic 312, and the ADC 308, respectively. An input of the disable logic 310 can be coupled to an output of the detection logic 312. An input of the detection logic 312 can be coupled to an output of the ADC 308. Another input of the ADC 308 can be coupled to an output of a signal path 320. An input of the signal path 320 can be coupled to an output driver 315 in a device 113 of the DUT 112 via a pin 316.

In operation, the control logic 302 can receive an instruction from the test system controller 102 via the communication link 134 to capture a test result signal during a particular test cycle. The control logic 302 can obtain an expected value of the test result signal in the instruction. The control logic 302 can provide the expected value of the test result signal to the detection logic 312. The control logic 302 can also reset the disable logic 310.

For purposes of exposition, assume the test result signal of interest is produced by a single pin of the DUT 112. Thus, during the test cycle, the output driver 315 can produce an output signal, which is coupled to the ADC 308 via the signal path 320 as the test result signal. When the particular test cycle is initiated, the control logic 302 may cause the ADC 308 to sample the voltage of the test result signal provided by the signal path 320. The ADC 308 can generate a code in response to the voltage of the test result signal, which may have a resolution of one or more bits. The different possible values of the output code can represent different values of the voltage of the test result signal, and hence different logic states of the test result signal.

The detection logic 312 can compare the code produced by the ADC 308 with the expected value of the code provided by the control logic 302. If the code produced by the ADC 308 does match the expected value, the detection logic 312 does not indicate a failure. If the code produced by the ADC 308 does not match the expected value, the detection logic 312 indicates a failure. Assume that a failure is detected and it is the first such failure. The disable logic 310 can then indicate the failure to the control logic 302. Thereafter, the disable logic 310 can be set in that the disable logic 310 can ignore the output of the detection logic 312 for subsequent test cycles. The control logic 302 can generate a failure indication for the pin 316, which can then be stored in the failure memory 150. Since the disable logic 310 transitions from reset to set in this test cycle, no more failure indications will be logged to the failure memory 150 for the pin 316 in subsequent test cycles or until the control logic 302 is instructed to reset the disable logic 310.

Now assume the test result signal of interest is produced by multiple pins of the DUT 112. Thus, during the test cycle, the output driver 315 and additional output drivers 314 can produce output signals, which are coupled to the signal path 320 via the pin 316 and additional pins 318. Operation of the test result capture can proceed differently depending on the structure of the signal path 320. For example, the signal path 320 may include isolation resistors having differing values across the pin 316 and the additional pins 318. Thus, the voltage of the test result signal produced at the output of the signal path 320 may be a known function of the output signals of the pin 316 and the pins 318 and the resistance values. The ADC 308 can sample this voltage and produce an output code that indicates the respective states of the pin 316 and the additional pins 318. If the ADC 308 does not have sufficient resolution to sample all of the possible voltage values of the test result signal, then the control logic 302 can cause the ADC 308 to take multiple samples of the voltage using different reference voltages. For example, if the ADC 308 has resolution for sampling two different voltage values, but the test result signal can have four different voltage values, the ADC can take two samples of the test signal voltage using two different reference voltages.

In another example, the signal path 320 may include switches in each branch coupled to the pin 316 and the additional pins 318. The switches can be opened and then selectively closed as the control logic 302 causes the ADC 308 to obtain samples of the voltage from each of the pin 316 and the pins 318. It is to be understood that the signal path 320 may have other known configurations. Those skilled in the art will appreciate that, depending on the configuration of the signal path 320, the control logic 302 can, in general, cause the ADC 308 to obtain one or more samples of the test result signal voltage such that the individual voltages produced by the pin 316 and the additional pins 318 can be derived. In some embodiments, in cases where the signal path 320 includes switches in each branch that are opened and closed selectively, the ADC 308 can be omitted if the test result signal produced by a DUT device is capable of driving the detection logic 312 (i.e., if the detection logic 312 can detect the difference between logic low and logic high of the test result signal).

The detection logic 312 can compare the code or codes produced by the ADC 308 with an expected value or expected values provided by the control logic 302. In this manner, the detection logic 312 can detect if any of the individual pin 316 and pins 318 have failures. The detection logic 312 can output failure indication(s), if any, to the disable logic 310. The disable logic 310 can then indicate the failure(s) to the control logic 302. Thereafter, the disable logic 312 is set to ignore the output of the detection logic 312 for any of the pin 316 and pins 318 that have already had failures. That is, the disable logic 310 effectively blocks indications of failures other than first failures. The control logic 302 can generate failure indication(s) for the pin(s), which can then be stored in the failure memory 150.

Figure 4:
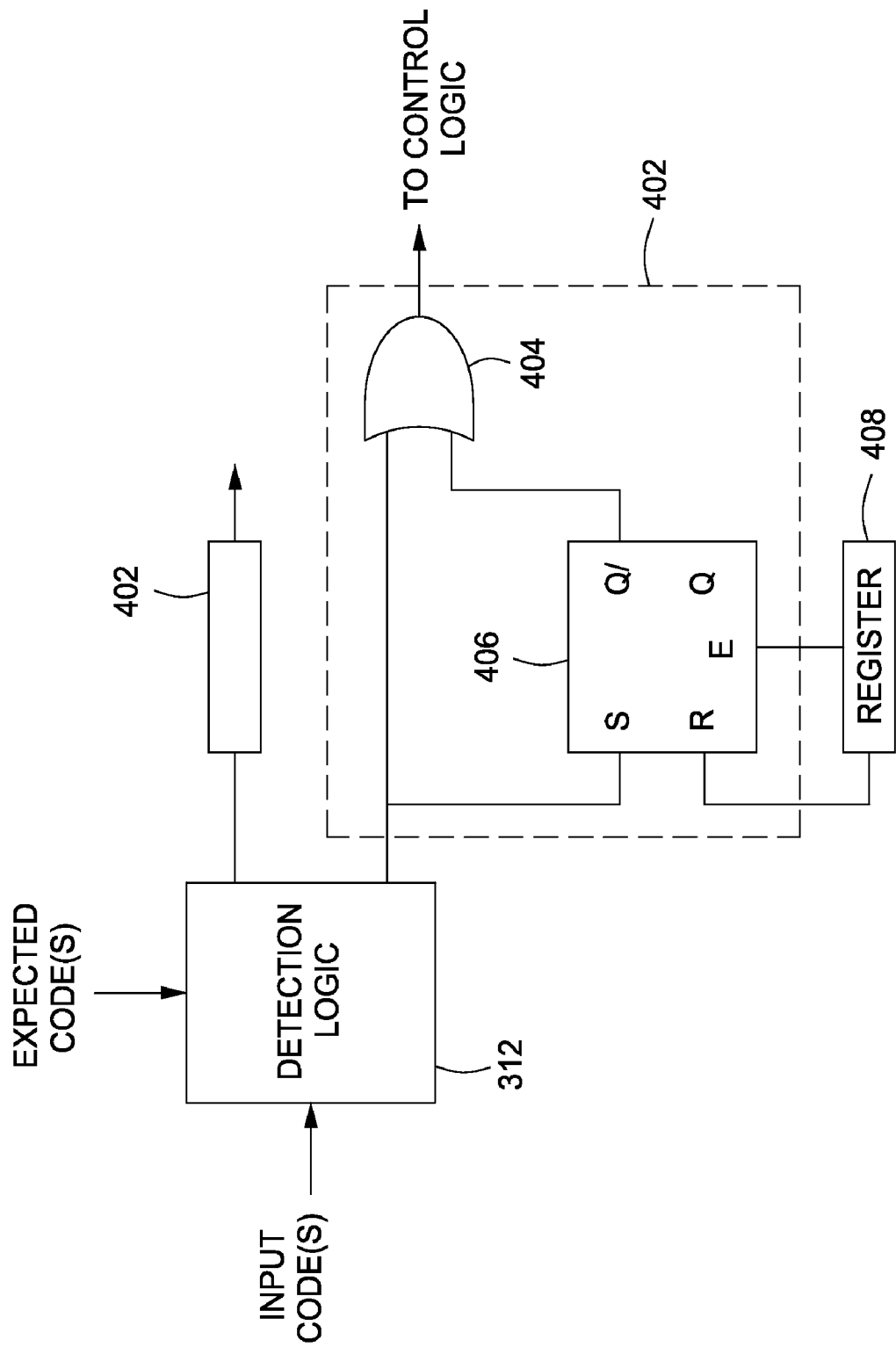
FIG. 4 is a block diagram depicting fail capture logic according to some non-limiting embodiments of the invention.

FIG. 4 is a block diagram depicting the fail capture logic 304 according to some non-limiting embodiments of the invention. The detection logic 312 can receive one or more input codes from the ADC 308, as well as one or more expected codes from the control logic 302. The detection logic 312 can compare the input code(s) with the expected code(s). In the present example, the detection logic 312 is configured to detect failures for a plurality of DUT pins. Accordingly, the detection logic 312 can include an output for each of the DUT pins. If the detection logic 312 detects a failure in any of the pins via the comparison, the detection logic 312 can assert the corresponding outputs for such pin(s) to indicate a failure on such pin(s). Those skilled in the art will understand how to construct the detection logic 312 to perform the aforementioned functionality using various digital logic elements, such as combinatorial logic gates, flip-flops, and the like.

The disable logic 310 can include a plurality of circuits 402 respectively coupled to the plurality of outputs of the detection logic 312. For clarity, only one of the circuits 402 is shown in detail, but each of the circuits 402 may be implemented similarly. Each of the circuits 402 can include a flip-flop 406 and an AND gate 404. The flip-flop 406 can include a set input S, a reset input R, an enable input E, and an inverted output Q/. The set input S can be coupled to an output of the detection logic 312. The reset input R and the enable input E can be coupled to an output of a register 408. The register 408 can be part of the control logic 302 or may be part of the circuit 402. The output Q/ can be coupled to an input of the AND gate 404. Another input of the AND gate 404 can be coupled to the output of the detection logic 312.

The register 408 may be configured to store two bits, one for the reset input R and one for the enable input E. The flip-flop 406 can be reset by causing the register 408 to drive the reset input R with an asserted input (e.g., a logical '1'). The flip-flop 406 can be enabled by causing the register 408 to drive the enable input E with an asserted input (e.g., a logical '1'). The values stored in the register 408 may be selected by the control logic 302 at the initiation of a test cycle.

Assume the detection logic 312 detects a failure on a pin and asserts an output to indicate the failure. Since the flip-flop 406 is initially reset, the output Q/ drives the AND gate 404 with an asserted value. Thus, the AND gate 406 can output an asserted value to indicate the failure of the pin to the control logic 302. Further, the flip-flop 406 becomes set, since the detection logic 312 drives the set input S with an asserted value. Thus, the flip-flop 406 will be set for subsequent test cycles. When the flip-flop 406 is set, the output Q/ drives the AND gate 404 with a de-asserted value (e.g., a logic 0). Thus, the AND gate 406 will continue to output a de-asserted value regardless of the state of the output from the detection logic 312 for subsequent test cycles. Accordingly, the circuit 402 only indicates a first failure of the pin and can effectively disable the output of the detection logic 312 for the pin until the flip-flop 406 is reset.

Figure 5:
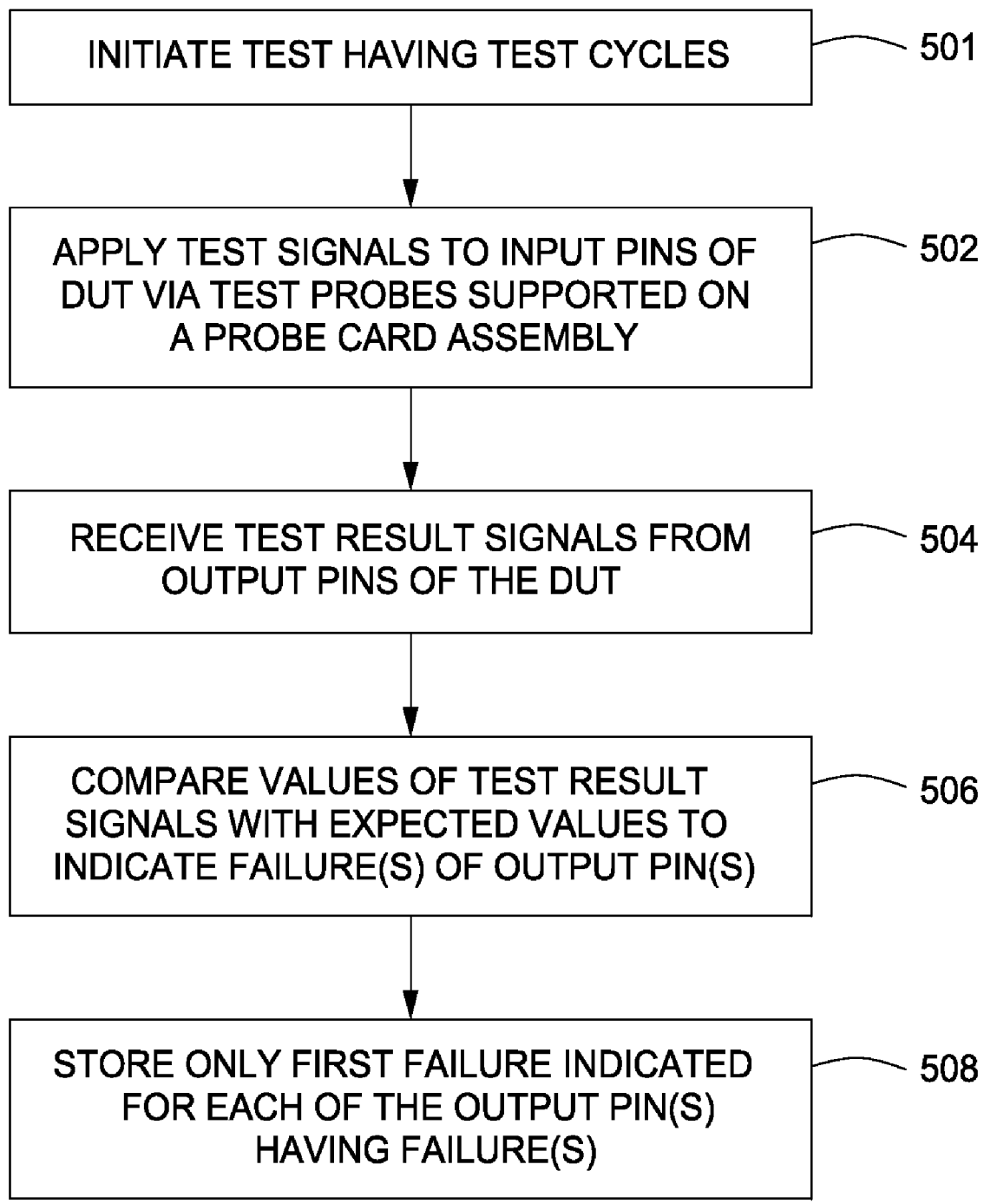
FIG. 5 is a flow diagram depicting a method of testing a DUT according to some embodiments of the invention.

FIG. 5 is a flow diagram depicting a method 500 of testing a DUT according to some embodiments of the invention. A test comprising a plurality of test cycles can be initiated (501). Test signals can be applied to input pins of the DUT via test probes supported on a probe card assembly (502). The test signals can be applied over the plurality of test cycles. Test result signals can be received from output pins of the DUT (504). Notably, in some cases, an output pin of the DUT also can be an input pin of the DUT (e.g., an IO pin). Each test result signal can be derived from an output signal or a combination of output signals produced by the DUT responsive to the test signals applied at 502. The test result signals can be received over the plurality of test cycles. Values of the test result signals can be compared with expected values to indicate one or more failures of one or more of the output pins (506). For each of the output pins, only a first failure indicated over the plurality of test cycles is stored in a memory (508). For each of the output pins, additional failures after the first failure are not stored in the memory. By only storing first failures of the output pins, the memory is conserved and an output pin that generates more failures than can be stored in the memory cannot cause the memory to overflow.

While the foregoing is directed to embodiments of the present invention, other and further embodiments of the invention may be devised without departing from the basic scope thereof, and the scope thereof is determined by the claims that follow.

The invention claimed is:

1. Apparatus for testing a device under test (DUT), comprising:
   probes configured to connect electrically with pins of the DUT including pins that are output pins;
   a memory; and
   fail capture logic coupled to ones of the test probes and the memory, the fail capture logic configured to allow to be written into the memory for each of the output pins individually an indication of only a first failure but not any subsequent failure detected on the individual output pin during a test of the DUT, wherein the fail capture logic is further configured to allow to be written into the memory an indication of only the first failure on a particular individual one of the output pins after an indication of the first failure has been written into the memory for a different individual one of the output pins.

2. The apparatus of claim 1, wherein the fail capture logic includes detection logic and disable logic, wherein the apparatus includes control logic, and wherein:
   the detection logic is configured to indicate the failures on the output pins of the DUT;
   the control logic is configured to store failure indications in the memory; and
   the disable logic is configured to provide indications of the first failures to the control logic and block indications of the failures other than the first failures from the control logic during the test.

3. The apparatus of claim 2, wherein the disable logic includes a logic circuit for each of the output pins, the logic circuit including combinatorial logic and a flip-flop.

4. The apparatus of claim 1, wherein the DUT includes multiple devices each having a portion of the output pins.

5. Apparatus for testing a device under test (DUT), comprising:
   fail capture logic, coupled to test probes and memory, to indicate only first failures of failures detected on output pins of the DUT during a test for storage in the memory; and
   analog-to-digital converter (ADC) logic coupled between the test probes and the fail capture logic, the ADC logic configured to sample voltages of test result signals, the test result signals derived from output signals of the output pins,
   wherein the fail capture logic includes detection logic and disable logic, wherein the apparatus includes control logic, and
   wherein:
      the detection logic is configured to indicate the failures on the output pins of the DUT;
      the control logic is configured to store failure indications in the memory; and
      the disable logic is configured to provide indications of the first failures to the control logic and block indications of the failures other than the first failures from the control logic during the test.

6. The apparatus of claim 5, wherein the ADC logic is configured to generate codes in response to the sampled voltages and to provide the codes to the detection logic, and wherein the detection logic is configured to indicate the failures in response to the codes.

7. The apparatus of claim 6, wherein the detection logic compares the codes to expected codes to indicate the failures.

8. A test assembly, comprising:
a probe card assembly having test probes configured to contact pins of a device under test (DUT);
test instruments having test channels coupled to a memory, each of the test channels including:
fail capture logic, coupled to ones of the test probes contacting output pins of the pins, to allow to be written into the memory for each of the output pins individually an indication of only a first failure but not any subsequent failure detected on the individual output pin during a test of the DUT, wherein the fail capture logic allows to be written into the memory an indication of only the first failure on a particular individual one of the output pins after an indication of the first failure has been written into the memory for a different individual one of the output pins.

9. The test assembly of claim 8, wherein the fail capture logic includes detection logic and disable logic, wherein the test instruments include control logic, and wherein
the detection logic is configured to indicate the failures on the at least one output pin;
the control logic is configured to store failure indications in the memory; and
the disable logic is configured to provide indications of the first failures to the control logic and block indications of the failures other than the first failures from the control logic during the test.

10. The test assembly of claim 9,
wherein the disable logic includes a logic circuit for each of the output pins, the logic circuit including:
a flip-flop including a set input coupled to the detection logic and an inverted output; and
a logic gate having a first input coupled to the detection logic, a second input coupled to the inverted output of the flip-flop, and an output coupled to the control logic.

11. The test assembly of claim 10, wherein the flip-flop includes a reset input and the test assembly comprises:
a register coupled to the reset input.

12. The test assembly of claim 8, wherein the DUT includes multiple devices each having a portion of the output pins.

13. A test assembly, comprising:
a probe card assembly having test probes configured to contact pins of a device under test (DUT);
test instruments having test channels coupled to a memory, each of the test channels including: fail capture logic, coupled to at least one of the test probes contacting at least one output pin of the pins, to indicate only first failures on the at least one output pin during a test for storage in the memory,
wherein the fail capture logic includes detection logic and disable logic, wherein the test instruments include control logic, and
wherein:
the detection logic is configured to indicate the failures on the at least one output pin;
the control logic is configured to store failure indications in the memory; and
the disable logic is configured to provide indications of the first failures to the control logic and block indications of the failures other than the first failures from the control logic during the test, and
wherein each of the test channels further includes:
an analog-to-digital converter (ADC) coupled between the fail capture logic and the at least one output pin, the ADC configured to obtain at least one sample of a voltage of a test result signal, the test result signal being derived from an output signal of each of the at least one output pin.

14. The test assembly of claim 13, wherein the ADC is configured to generate at least one code in response to the at least one sample and to provide the at least one code to the detection logic, and wherein the detection logic is configured to indicate the failures in response to the at least one code.

15. The test assembly of claim 14, wherein the detection logic is configured to compare the at least one code to at least one expected code to indicate the failures.

16. A method of testing a device under test (DUT) using a probe card assembly, comprising:
applying test signals to input pins of the DUT during a test via test probes supported on the probe card assembly;
receiving test result signals derived from output pins of the DUT responsive to the test signals; and
storing in a memory for each of the output pins individually an indication of only a first failure but not any subsequent failure detected on the individual output pin, wherein the storing in a memory stores an indication of the first failure on a particular individual one of the output pins after an indication of the first failure has been stored in the memory for a different individual one of the output pins.

17. The method of claim 16, wherein the step of receiving comprises:
sampling voltages of the test result signals to generate codes.

18. The method of claim 17, further comprising:
comparing the codes with expected codes to indicate failures on the output pins.

19. The method of claim 18, wherein the step of storing comprises:
blocking indications of the failures other than the first failures on the output pins from storage in the memory.

20. The method of claim 16, wherein the DUT includes multiple devices each having a portion of the output pins.

* * * * *